United States Patent
Ryu et al.

(10) Patent No.: US 9,825,066 B2
(45) Date of Patent: Nov. 21, 2017

(54) THIN FILM TRANSISTOR SUBSTRATE AND METHOD OF MANUFACTURING A THIN FILM TRANSISTOR SUBSTRATE

(71) Applicant: SAMSUNG DISPLAY CO., LTD, Yongin, Gyeonggi-do (KR)

(72) Inventors: Myung-Kwan Ryu, Yongin-si (KR); Eok-Su Kim, Seoul (KR); Kyoung Seok Son, Seoul (KR); Seung-Ha Choi, Suwon-si (KR); Sho-Yeon Kim, Hwaseong-si (KR); Hyun Kim, Suwon-si (KR); Eun-Hye Park, Incheon (KR); Byung-Hwan Chu, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/990,383

(22) Filed: Jan. 7, 2016

(65) Prior Publication Data

US 2016/0211281 A1 Jul. 21, 2016

(30) Foreign Application Priority Data

Jan. 19, 2015 (KR) .......................... 10-2015-0008799

(51) Int. Cl.
  *H01L 27/12* (2006.01)
  *H01L 29/786* (2006.01)
  *H01L 29/417* (2006.01)

(52) U.S. Cl.
  CPC ........ *H01L 27/1248* (2013.01); *H01L 27/127* (2013.01); *H01L 27/1225* (2013.01); *H01L 29/41733* (2013.01); *H01L 29/78696* (2013.01)

(58) Field of Classification Search
  CPC ......... H01L 29/78642; H01L 29/78696; H01L 29/66757; H01L 29/66765; H01L 29/7869
  USPC ....... 257/223, 227, 291, 292, 439, 443, 655, 257/E27.1, E27.125, E27.112, E29.117, 257/E29.145, E29.147, E29.151, E29.182, 257/E29.202, E29.273–E29.299, E29.314, 257/E29.32, E23.016
  See application file for complete search history.

(56) References Cited

U.S. PATENT DOCUMENTS

| | | | |
|---|---|---|---|
| 2006/0175609 A1* | 8/2006 | Chan ................. | H01L 29/66787 257/59 |
| 2012/0313093 A1 | 12/2012 | Kim et al. | |
| 2013/0161732 A1* | 6/2013 | Hwang .............. | H01L 29/7827 257/329 |
| 2014/0061722 A1 | 3/2014 | Doornbos et al. | |
| 2014/0097400 A1 | 4/2014 | Kim et al. | |
| 2014/0097479 A1 | 4/2014 | Thomas | |
| 2016/0035903 A1* | 2/2016 | Okachi ............. | H01L 29/78603 257/66 |

FOREIGN PATENT DOCUMENTS

| | | |
|---|---|---|
| JP | 2006-032836 | 2/2006 |
| JP | 2011-023741 | 2/2011 |
| KR | 10-2014-0039271 | 4/2014 |

* cited by examiner

*Primary Examiner* — Jonathan Han
(74) *Attorney, Agent, or Firm* — H.C. Park & Associates, PLC

(57) ABSTRACT

A thin film transistor substrate includes a gate electrode, a channel layer overlapping the gate electrode, a source electrode overlapping the channel layer, a drain electrode overlapping the channel layer and the source electrode, and a spacer disposed between the source electrode and the drain electrode.

20 Claims, 11 Drawing Sheets

THIN FILM TRANSISTOR SUBSTRATE AND METHOD OF MANUFACTURING A THIN FILM TRANSISTOR SUBSTRATE

CLAIM OF PRIORITY

This application claims the priority of and all the benefits accruing under 35 U.S.C. §119 to Korean Patent Application No. 10-2015-0008799, filed on Jan. 19, 2015 in the Korean Intellectual Property Office (KIPO), and the content of which is herein incorporated by reference in its entirety.

BACKGROUND OF THE INVENTION

1. Field of Disclosure

Exemplary embodiments relate to a thin film transistor. More particularly, exemplary embodiments relate to a thin film transistor substrate and a method for manufacturing a thin film transistor substrate.

2. Description of the Related Art

A thin film transistor includes a gate electrode, a source electrode, a drain electrode and a channel connecting the source electrode and the drain electrode to each other. The gate electrode overlaps the channel. The source electrode and the drain electrode are spaced apart from each other. The channel may include a semiconductive material such as amorphous silicon, polysilicon, semiconductive oxide or the like.

When the channel is turned on by a gate voltage, the source electrode and the drain electrode are electrically connected to each other through the channel. A gap between the source electrode and the drain electrode may be defined as a channel length. When the channel length is reduced, an electron-moving path in the channel is reduced. Thus, electric characteristics of the thin film may be improved.

Reducing the channel length by a conventional manufacturing method is difficult due to technical limitation of a light-exposure process or the like.

SUMMARY OF THE INVENTION

Exemplary embodiments provide a thin film transistor substrate having improved electrical characteristics.

Exemplary embodiments also provide a method for manufacturing the thin film transistor substrate.

According to an exemplary embodiment, a thin film transistor substrate includes a gate electrode, a channel layer overlapping the gate electrode, a source electrode overlapping the channel layer, a drain electrode overlapping the channel layer and the source electrode, and a spacer disposed between the source electrode and the drain electrode.

In an exemplary embodiment, the spacer includes a metal oxide.

In an exemplary embodiment, the spacer includes an oxide of a metal included in the source electrode or the drain electrode.

In an exemplary embodiment, the spacer includes at least one of aluminum oxide, copper oxide, molybdenum oxide, manganese oxide and titanium oxide.

In an exemplary embodiment, a thickness of the spacer is about 0.01 µm to about 1 µm.

In an exemplary embodiment, the spacer partially covers an upper surface of the source electrode.

In an exemplary embodiment, the spacer partially covers an upper surface of the drain electrode.

In an exemplary embodiment, the source electrode, the drain electrode and the spacer are disposed on the channel layer.

In an exemplary embodiment, the source electrode, the drain electrode and the spacer are disposed under the channel layer.

In an exemplary embodiment, the drain electrode and the channel layer are spaced apart from each other by the spacer, and the spacer includes a semiconductive material.

In an exemplary embodiment, the spacer includes at least one of amorphous silicon, polysilicon, an organic semiconductor, a chalcogenide semiconductor and a metal oxide.

In an exemplary embodiment, the thin film transistor substrate further includes a gate line electrically connected to the gate electrode, a data line electrically connected to the source electrode, and a pixel electrode electrically connected to the drain electrode.

According to an exemplary embodiment, a thin film transistor substrate includes a gate electrode, a semiconductor pattern overlapping the gate electrode, a source electrode overlapping the semiconductor pattern, and a drain electrode overlapping the semiconductor pattern and the source electrode and spaced apart from the source electrode by the semiconductor pattern.

According to an exemplary embodiment, a method for manufacturing a thin film transistor substrate is provided. According to the method, a gate electrode is formed. A source electrode overlapping the gate electrode is formed. A metal oxide layer covering the source electrode is formed. A drain electrode overlapping at least a portion of the metal oxide layer is formed. A channel layer overlapping the gate electrode is formed.

In an exemplary embodiment, a surface portion of the source electrode is oxidized to form the metal oxide layer.

In an exemplary embodiment, the metal oxide layer is patterned to expose a portion of an upper surface of the source electrode In an exemplary embodiment, a semiconductor layer disposed under the source electrode is patterned by using the source electrode and the drain electrode as a mask.

According to the exemplary embodiments, the drain electrode and the source electrode overlap with each other in a plan view, and are spaced apart from each other by the spacer disposed therebetween. Thus, a channel length of the thin film transistor may be minimized or reduced.

Furthermore, the spacer may be formed without using an additional mask, and the channel layer may be formed by using the source electrode and the drain electrode as a mask.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION

Exemplary embodiments will be described more fully hereinafter with reference to the accompanying drawings, in which various embodiments are shown.

Figure 1:
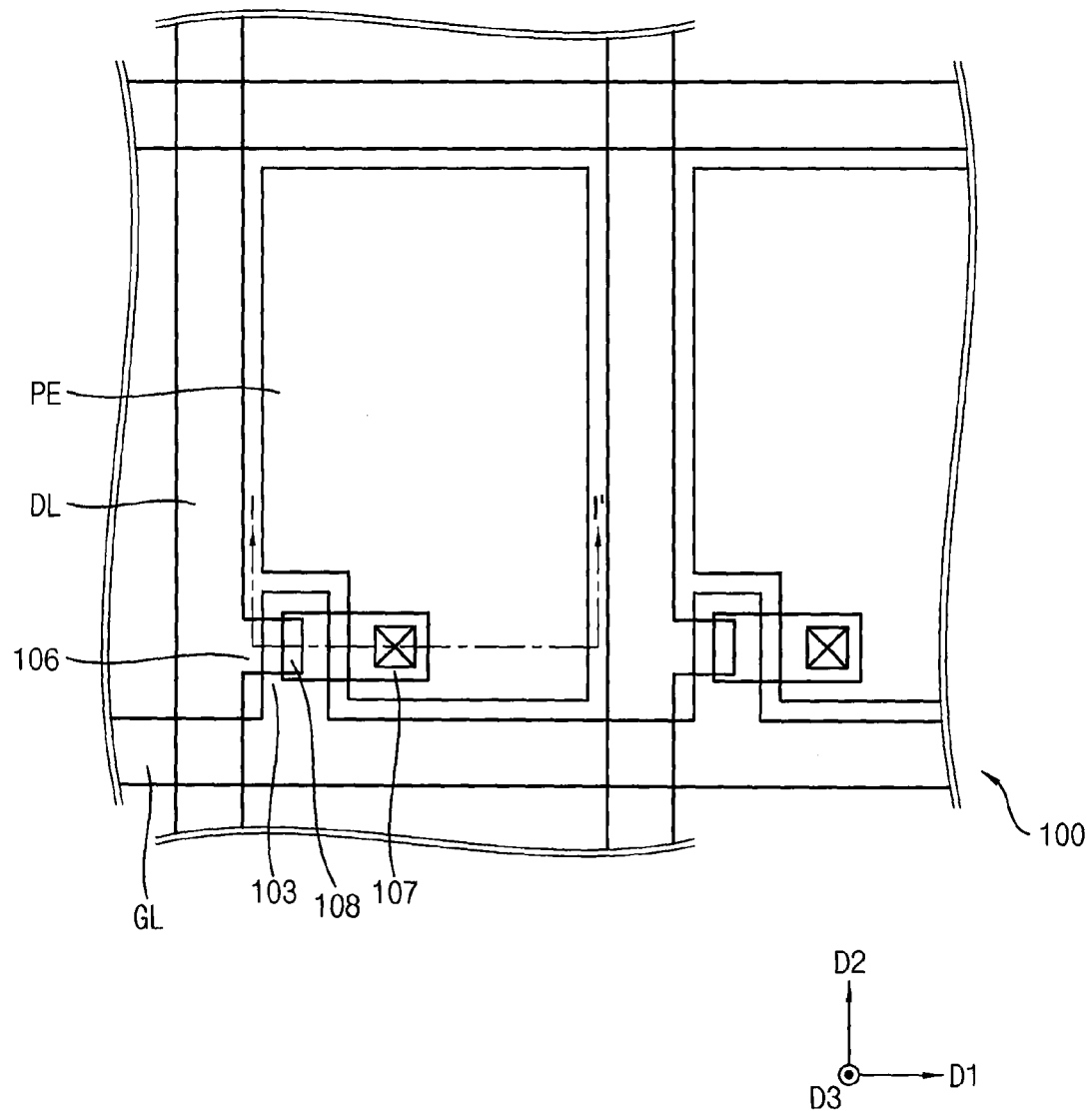
FIG. 1 is a plan view illustrating a thin film transistor substrate according to an exemplary embodiment.
Figure 2:
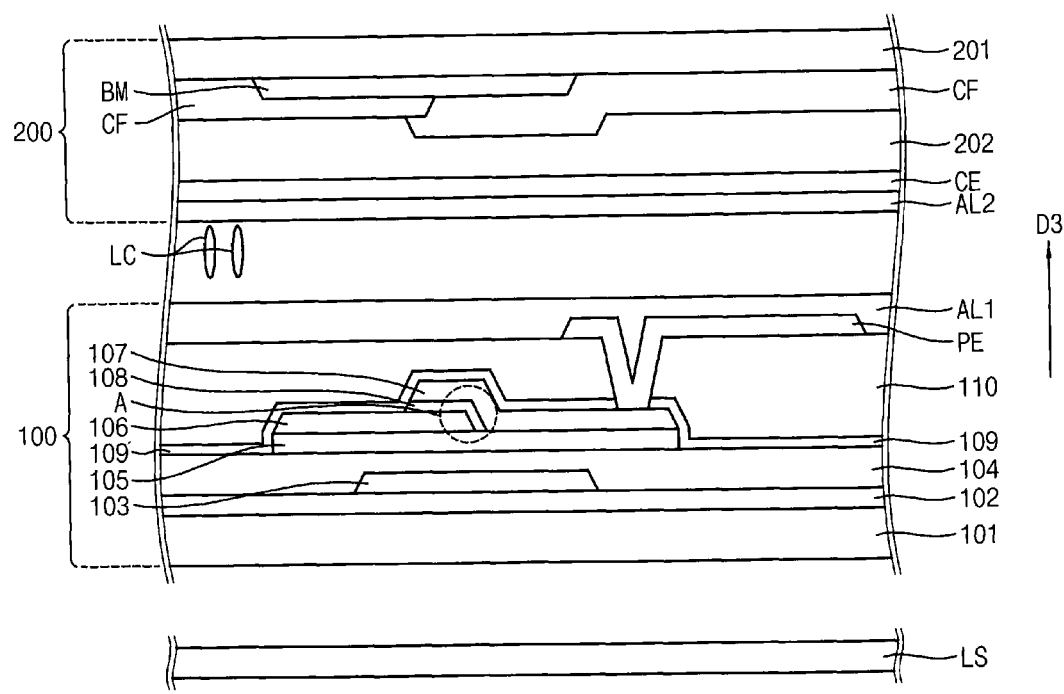
FIG. 2 is a cross-sectional view illustrating a display device according to an exemplary embodiment, taken along the line I-I' of FIG. 1.
Figure 3:
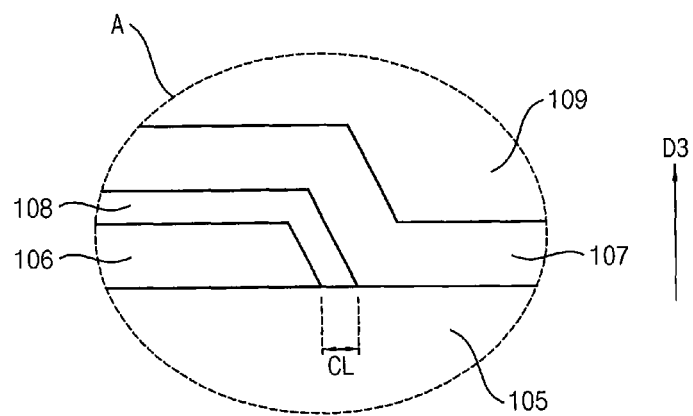
FIG. 3 is an enlarged cross-section view of the region "A".

FIG. 1 is a plan view illustrating a thin film transistor substrate according to an exemplary embodiment. FIG. 2 is a cross-sectional view illustrating a display device according to an exemplary embodiment, taken along the line I-I' of FIG. 1. FIG. 3 is an enlarged cross-section view of the region "A".

Referring to FIGS. 1 to 3, a display device includes a display panel and a light source LS. The light source LS is disposed under the display panel to provide a light to the display panel. The display panel controls a transmittance of a light provided by the light source LS to display an image. The light source LS may be a conventional backlight assembly. For example, the light source LS may include a light-emitting diode, a fluorescent lamp or the like.

The display panel includes a thin film transistor substrate 100, an opposing substrate 200 facing the thin film transistor substrate 100, and a liquid crystal layer LC disposed between the thin film transistor substrate 100 and the opposing substrate 200. The liquid crystal layer LC may include liquid crystal molecules that have electrical anisotropy and optical anisotropy. The liquid crystal molecules are orientated in a direction by an electric field applied thereto to control a transmittance of a light passing through the liquid crystal layer LC.

The thin film transistor substrate 100 includes a first base substrate 101, a gate electrode 103, a channel layer 105, a source electrode 106, a drain electrode 107 and a spacer 108. The thin film transistor substrate 100 may further include a buffer layer 102, a gate insulation layer 104, a passivation layer 109, a flattening layer 110, a pixel electrode PE and a first alignment layer AL1.

The first base substrate 101 may include glass, quartz, flexible plastic material or the like. The plastic material may include polymer resin such as polyethylene terephthalate, polyethylene naphthalate, polyetherketone, polycarbonate, polyarylate, polyethersulfone, polyimide or the like.

The gate electrode 103 is disposed on the first base substrate 101. The gate electrode 103 is electrically connected to a gate line GL. The gate electrode 103 may be formed from a same layer as the gate line GL, or from a different layer from the gate line GL.

The gate line GL may extend in a first direction D1. In an exemplary embodiment, the gate electrode 103 may protrude from the gate line GL in a second direction D2 crossing the first direction D1. In another exemplary embodiment, the gate electrode 103 may not protrude from the gate line GL, and a portion of the gate line GL, which overlaps the channel layer 105, may be defined as a gate electrode.

The gate electrode 103 may include aluminum, silver, copper, molybdenum, chromium, manganese, titanium, alloy thereof or the like. These may be used each alone or in a combination thereof.

The gate electrode 103 may have a single-layered structure or a multiple-layered structure including different layers. For example, the gate electrode 103 may have a double-layered structure or a triple-layered structure. For example, the gate electrode 103 may have a double-layered structure of copper/titanium, or a triple-layered structure of aluminum/molybdenum/aluminum. Furthermore, the gate electrode 103 may have a multiple-layered structure including a metal layer and a metal oxide layer.

The buffer layer 102 is disposed between the first base substrate 101 and the gate electrode 103. The buffer layer 102 may include an insulation material such as silicon oxide, silicon nitride or the like. The buffer layer 102 may have a single-layered structure or a multiple-layered structure including different layers. The buffer layer 102 may prevent impurities from penetrating into the first base substrate 101 and may improve adhesion of the gate electrode 103 and the first base substrate 101. In another exemplary embodiment, the buffer layer 102 may be omitted so that the gate electrode 103 may be disposed directly on the first base substrate 101.

The gate insulation layer 104 covers the gate electrode 103. The gate insulation layer 104 may include an insulation material such as silicon oxide, silicon nitride or the like. The gate insulation layer 104 may have a single-layered structure or a multiple-layered structure including different layers. For example, the gate insulation layer 104 may have a double-layered structure of silicon oxide/silicon nitride or a triple-layered structure of silicon nitride/silicon oxide/silicon nitride.

The channel layer 105 is disposed on the gate insulation layer 104, and overlaps the gate electrode 103. The channel layer 105 may include amorphous silicon, polysilicon, an organic semiconductor, a chalcogenide semiconductor, a metal oxide or the like.

For example, the metal oxide may include a metal oxide based on aluminum, gallium, indium, zinc, tin, hafnium, zirconium or the like, or their combination. For example, the metal oxide may include aluminum zinc oxide (AZO), zinc tin oxide (ZTO), indium zinc tin oxide (IZTO), aluminum zinc tin oxide (AZTO), indium gallium zinc oxide (IGZO) or the like.

In an exemplary embodiment, the channel layer 105 overlaps the source electrode 106 and the drain electrode 107. For example, an outer boundary of the channel layer 105 may extend along an outer boundary of the source electrode 106 and the drain electrode 107 in a plan view.

The source electrode 106, the spacer 108 and the drain electrode 107 are disposed on the channel layer 105.

In an exemplary embodiment, the source electrode 106 and the drain electrode 107 may be entirely disposed on the channel layer 105. In another exemplary embodiment, the source electrode 106 and the drain electrode 107 may be partially disposed on the channel layer 105.

The source electrode 106 is electrically connected to a data line DL. The source electrode 106 may be formed from a same layer as the data line DL or from a different layer from the data line DL.

The data line DL extends in the second direction D2. In an exemplary embodiment, the source electrode 106 may protrude from the data line DL in the first direction D1. In another exemplary embodiment, the source electrode 106 may not protrude from the data line DL, and a portion of the data line DL, which overlaps the channel layer 105, may be defined as a source electrode.

The source electrode 106 may include aluminum, silver, copper, molybdenum, chromium, manganese, titanium, alloy thereof or the like. These may be used each alone or in a combination thereof.

The source electrode 106 may have a single-layered structure or a multiple-layered structure including different layers. For example, the source electrode 106 may have a double-layered structure or a triple-layered structure. For example, the source electrode 106 may have a double-layered structure of copper/titanium, or a triple-layered structure of aluminum/molybdenum/aluminum. Furthermore, the source electrode 106 may have a multiple-layered structure including a metal layer and a metal oxide layer.

For example, when the channel layer 105 includes amorphous silicon, the source electrode 106 may further include an ohmic contact layer contacting the channel layer 105.

For example, when the channel layer 105 includes a metal oxide, the source electrode 106 may further include a metal oxide layer contacting the channel layer 105.

The drain electrode 107 overlaps the channel layer 105 and the source electrode 106 in a plan view. In an exemplary embodiment, the drain electrode 107 covers a portion of an upper surface of the source electrode 106. The drain electrode 107 may include a same material as the source electrode 106 or a different material from the source electrode 106.

The spacer 108 is disposed between the drain electrode 107 and the source electrode 106 so that the drain electrode 107 is spaced apart from the source electrode 106. For example, the spacer 108 contacts at least a portion of a lower surface of the drain electrode 107.

The spacer 108 may include an insulation material. For example, the spacer 108 may include silicon oxide, silicon nitride, metal oxide or the like.

In an exemplary embodiment, the spacer 108 may include a metal oxide. For example, the metal oxide may include aluminum oxide, copper oxide, molybdenum oxide, manganese oxide, titanium oxide or the like. The spacer 108 including the metal oxide may be formed through oxidation of the source electrode 106 without an additional masking process. Thus, the spacer 108 may include a metal oxide of a metal included in the source electrode 106. The spacer 108 may have a single-layered structure or a multiple-layered structure including a plurality of layers including different materials.

For example, a thickness of the spacer 108 may be about 0.01 μm to about 1 μm. The spacer 108 may have a layer shape extending along a surface of the source electrode 106. Since the source electrode 106 and the drain electrode 107 are spaced apart from each other by the spacer 108, a channel length CL of the thin film transistor may be about 0.01 μm to about 1 μm. The channel length CL of the thin film transistor may be defined as a width of an end of the spacer 108, which contacts the channel layer 105.

The thin film transistor may have a reduced channel length as compared to a convention thin film transistor including a source electrode and a drain electrode, which are spaced apart from each other in a plan view. Thus, electrical characteristics the thin film transistor may be improved.

The passivation layer 109 covers the source electrode 106, the drain electrode 107 and the spacer 108. The passivation layer 109 may include an insulation material such as silicon oxide, silicon nitride or the like.

The flattening layer 110 is disposed on the passivation layer 109 to flatten an upper surface of the substrate. For example, the flattening layer 110 may include an organic material such as an acryl resin, a phenol resin, or the like.

In another exemplary embodiment, the passivation layer 109 or the flattening layer 110 may be omitted.

The pixel electrode PE is disposed on the flattening layer 110. The pixel electrode PE is electrically connected to the drain electrode 107. For example, the pixel electrode PE may contact the drain electrode 107 through a contact hole formed through the passivation layer 109 and the flattening layer 110.

The pixel electrode PE may include a transparent conductive material. For example, the pixel electrode PE may include a metal oxide such as indium tin oxide, indium zinc oxide, tin oxide, zinc oxide or the like.

The first alignment layer AL1 is disposed on the pixel electrode PE. The first alignment layer AL1 may align adjacent liquid crystal molecules in a direction. The first alignment layer AL1 may include a polymer resin such as polyimide or the like.

The opposing substrate 200 includes a second base substrate 201, a light-blocking layer BM, a color filter CF, a common electrode CE and a second alignment layer AL2.

The second base substrate 201 may include a material substantially same as the first base substrate 101.

The light-blocking layer BM is disposed on a surface of the second base substrate 201. The light-blocking layer BM may have a matrix shape. For example, the light-blocking layer BM may overlap at least one of the data line DL, the gate line GL and the thin film transistor. The light-blocking layer BM may include carbon black, a mixture of pigments or the like.

The color filter CF is disposed on a surface of the second base substrate 201. The color filter CF overlaps the pixel electrode PE. Furthermore, the color filter CF may partially overlap the light-blocking layer BM. For example, the color filter CF may include a red filter, a green filter, a blue filter, a yellow filter or the like.

In an exemplary embodiment, color filters adjacent to each other may overlap with each other, and an overlapped portion of the adjacent color filters may overlap the light-blocking layer BM. In another exemplary embodiment, color filters adjacent to each other may be spaced apart from each other.

For example, the color filter CF may include a dye, a pigment, a mixture thereof or the like.

The common electrode CE is disposed on the color filter CF to face the pixel electrode PE. The common electrode CE may include a transparent conductive material. For example, the common electrode CE may include a metal oxide such as indium tin oxide, indium zinc oxide, tin oxide, zinc oxide or the like.

When a voltage is applied to the pixel electrode PE and the common electrode CE, an electric field is formed. The liquid crystal layer LC is orientated depending on the electric field.

While the opposing substrate 200 includes the light-blocking layer BM and the color filter CF, exemplary embodiments are not limited thereto. In another exemplary embodiment, at least one of the light-blocking layer BM and the color filter CF may be included in the thin film transistor substrate 100.

The second alignment layer AL2 covers the common electrode CE. The second alignment layer AL2 may align adjacent liquid crystal molecules in a direction. In an exemplary embodiment, the second alignment layer AL2 may include a substantially same material as the first alignment layer AL1.

FIGS. 4 to 10 are cross-sectional views illustrating a method for manufacturing the thin film transistor substrate illustrated in FIG. 2.

Figure 4:
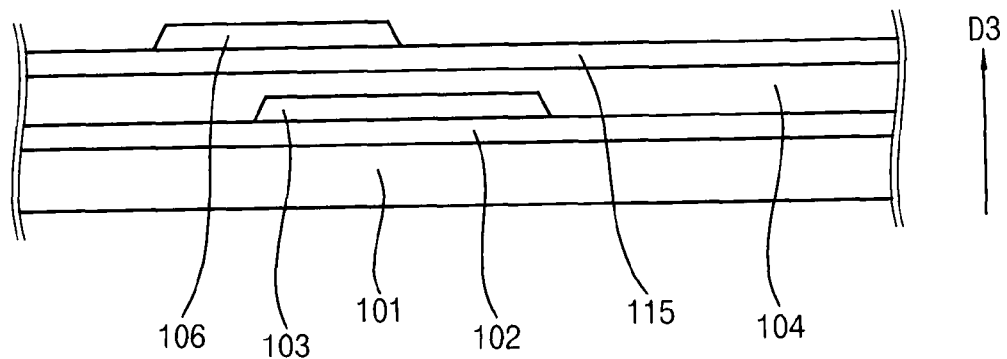
FIGS. 4 to 10 are cross-sectional views illustrating a method for manufacturing the thin film transistor substrate illustrated in FIG. 2.

Referring to FIG. 4, a buffer layer 102 is formed on a first base substrate 101. A gate metal layer is formed on the buffer layer 102, and patterned to form a gate metal pattern including a gate electrode 103. The gate metal pattern may further include a gate line connected to the gate electrode 103.

A gate insulation layer 104 is formed to cover the gate electrode 103. A semiconductor layer 115 is formed on the gate insulation layer 104. The semiconductor layer 115 may include amorphous silicon, polysilicon, an organic semiconductor, a chalcogenide semiconductor, a metal oxide or the like. For example, the metal oxide may include a metal oxide based on aluminum, gallium, indium, zinc, tin, hafnium, zirconium or the like, or their combination. For example, the metal oxide may include aluminum zinc oxide, zinc tin oxide, indium zinc tin oxide, aluminum zinc tin oxide, indium gallium zinc oxide or the like.

A source metal layer is formed on the semiconductor layer 115, and patterned to form a source metal pattern including a source electrode 106. The source metal pattern may further include a data line connected to the source electrode 106. As the source metal layer is partially removed, an upper surface of the semiconductor layer 115 is partially exposed.

Figure 5:
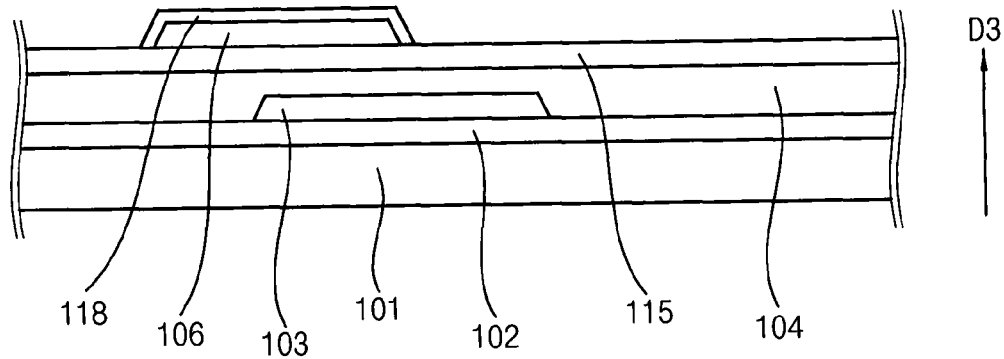

Referring to FIG. 5, a metal oxide layer 118 covering the source electrode 106 is formed. In an exemplary embodiment, the metal oxide layer 118 is formed through oxidization of the source electrode 106.

For example, after the source electrode 106 is formed, an oxygen plasma may be applied to the source electrode 106, or heat may be provided to the source electrode 106 in the presence of oxygen. As a result, a surface portion of the source electrode 106 is oxidized to form the metal oxide layer 118. For example, the metal oxide layer 118 may include aluminum oxide, copper oxide, molybdenum oxide, manganese oxide, titanium oxide or the like.

Figure 6:
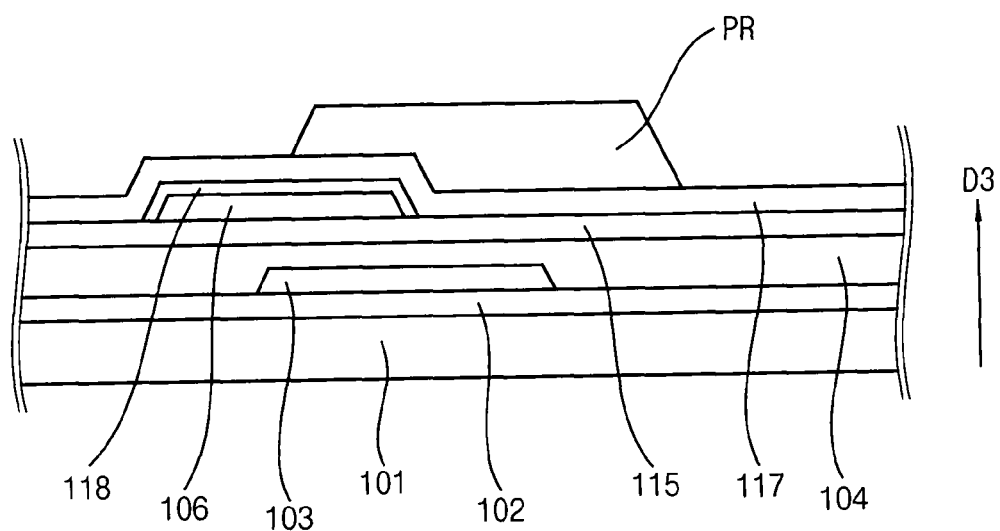

Referring to FIG. 6, a drain metal layer 117 is formed to cover the semiconductor layer 115 and the metal oxide layer 118. While the drain metal layer 117 may include a substantially same material as the source metal layer in an exemplary embodiment, the drain metal layer 117 may include a material different from the source metal layer, as desired, in another exemplary embodiment.

A mask pattern PR is formed on the drain metal layer 117. The mask pattern PR partially overlaps the metal oxide layer 118. The mask pattern PR may be a photoresist pattern formed through a photolithography process.

Figure 7:
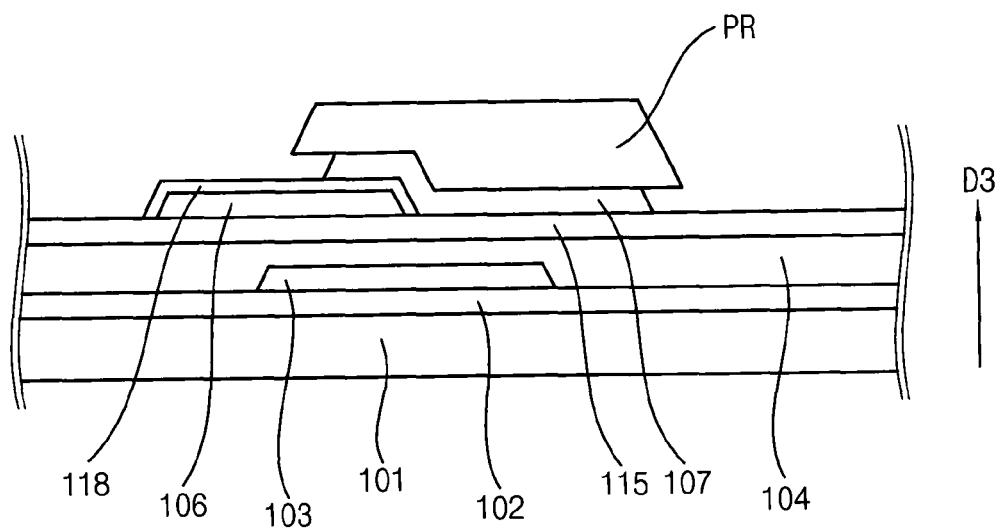

Referring to FIG. 7, the drain metal layer 117 is patterned by using the mask pattern PR as a mask to form a drain electrode 107. The drain electrode 107 partially covers the metal oxide layer 118, and contacts the semiconductor layer 115. Furthermore, the drain electrode 107 partially overlaps the source electrode 106. As the drain metal layer 117 is patterned, the metal oxide layer 118 is partially exposed.

Figure 8:
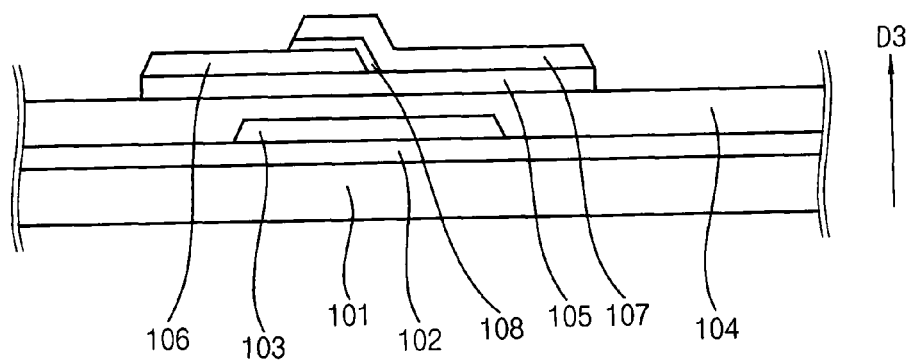

Referring to FIG. 8, an exposed portion of the metal oxide layer 118 is removed to form a spacer 108. Furthermore, the semiconductor layer 115 is patterned by using the source electrode 106 and the drain electrode 107 as a mask to form a channel layer 105. An order for etching the metal oxide layer 118 and the semiconductor layer 115 may be changed depending on a process condition or etching ratios of the metal oxide layer 118 and the semiconductor layer 115. In an exemplary embodiment, the semiconductor layer 115 may be patterned after the metal oxide layer 118 is partially removed. In another exemplary embodiment, the metal oxide layer 118 may be partially removed after the semiconductor layer 115 is patterned. In another exemplary embodiment, etching the metal oxide layer 118 may be omitted.

Figure 9:
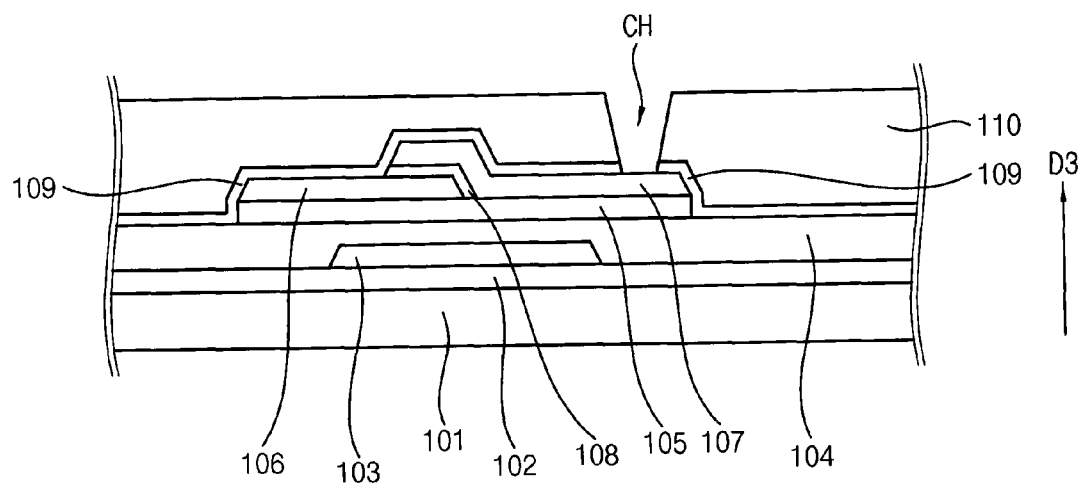

Referring to FIG. 9, a passivation layer 109 is formed to cover the source electrode 106 and the drain electrode 107. A flattening layer 110 is formed on the passivation layer 109.

The flattening layer 110 may be formed from a photoresist composition. A contact hole CH passing through the flattening layer 110 and the passivation layer 109 may be formed through a photolithography process to expose the drain electrode 107.

Figure 10:
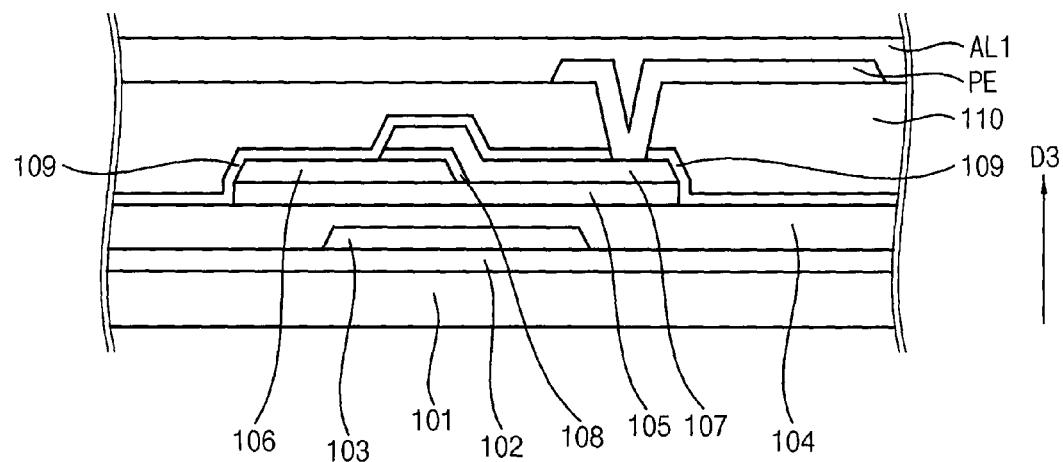

Referring to FIG. 10, a transparent conductive layer is formed on the flattening layer 110, and patterned to form a pixel electrode PE contacting the drain electrode 107 through the contact hole CH. A first alignment layer AL1 is formed to cover the pixel electrode PE.

According to an exemplary embodiment, the drain electrode 107 and the source electrode 106 overlap with each other in a plan view, and are spaced apart from each other by the spacer 108 disposed therebetween. Thus, a channel length of the thin film transistor may be minimized or reduced.

Furthermore, the spacer 108 may be formed without using an additional mask, and the channel layer 105 may be formed by using the source electrode 106 and the drain electrode 107 as a mask. Thus, a manufacturing efficiency may be improved.

In another exemplary embodiment, the spacer 108 may include an insulation material such as silicon oxide, silicon nitride, zinc oxide nitride ($ZnO_xN_y$) or the like. When the spacer 108 includes the insulation material, an additional process using an additional mask may be performed for forming the spacer 108.

Figure 11:
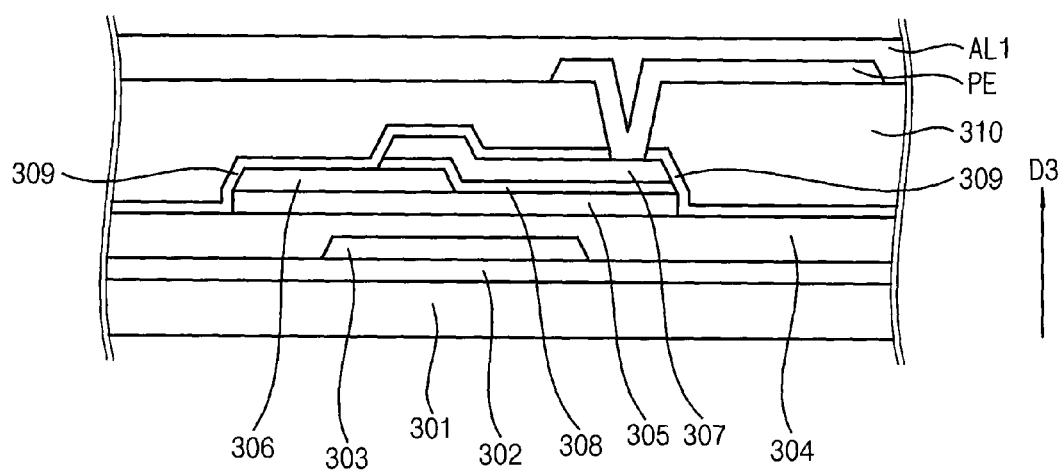
FIG. 11 is a cross-sectional view illustrating a thin film transistor substrate according to an exemplary embodiment.

FIG. 11 is a cross-sectional view illustrating a thin film transistor substrate according to an exemplary embodiment.

Referring to FIG. 11, a thin film transistor substrate 300 includes a base substrate 301, a gate electrode 303, a channel layer 305, a source electrode 306, a drain electrode 307 and a spacer 308. The thin film transistor substrate 300 may further include a buffer layer 302, a gate insulation layer 304, a passivation layer 309, a flattening layer 310, a pixel electrode PE and an alignment layer AL1. The thin film transistor substrate 300 may be substantially same as the thin film transistor substrate 100 illustrated in FIG. 2 except for the spacer 308. Thus, any duplicated explanation may be omitted.

The channel layer 305 overlaps the source electrode 306, the spacer 308 and the drain electrode 307. The source electrode 306, the spacer 308 and the drain electrode 307 are disposed on the channel layer 305. The source electrode 306 and the spacer 308 contact the channel layer 305. The drain electrode 307 is disposed on the spacer 308. Thus, the drain electrode 307 is spaced apart from the channel layer 305.

The source electrode 306 overlaps the drain electrode 307 in a plan view. For example, the drain electrode 307 may cover a portion of an upper surface of the source electrode 306.

The spacer 308 is disposed between the source electrode 306 and the drain electrode 307. For example, the spacer 308 may cover a portion of an upper surface of the source electrode 306.

The spacer 308 includes a semiconductive material. For example, the spacer 308 may include a metal oxide based on aluminum, gallium, indium, zinc, tin, hafnium, zirconium or the like, or their combination. For example, the spacer 308 may include aluminum zinc oxide, zinc tin oxide, indium zinc tin oxide, aluminum zinc tin oxide, indium gallium zinc oxide or the like. Furthermore, the spacer 308 may include amorphous silicon, polysilicon, an organic semiconductor, a chalcogenide semiconductor or the like.

Thus, even if the drain electrode 307 does not contact the channel layer 305, when a gate voltage is applied to the gate electrode 303, a data voltage applied to the source electrode 306 may be provided to the drain electrode 307 and the pixel electrode PE through the channel layer 305 and the spacer 308.

FIGS. 12 to 16 are cross-sectional views illustrating a method for manufacturing the thin film transistor substrate illustrated in FIG. 11.

Figure 12:
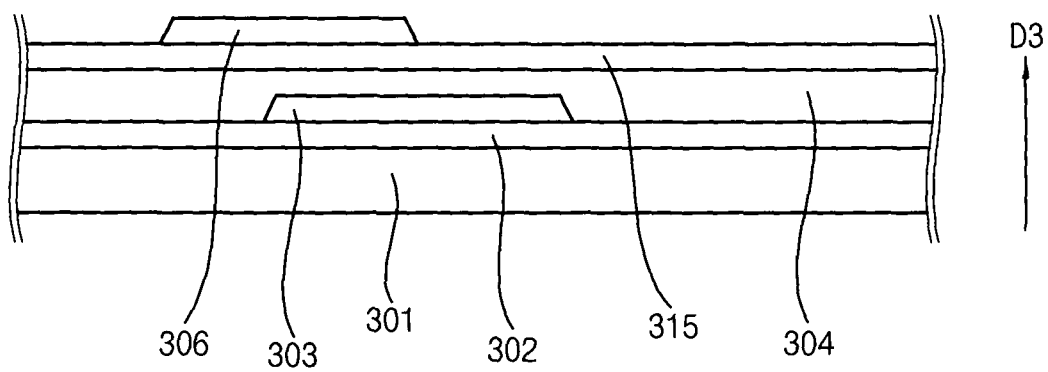
FIGS. 12 to 16 are cross-sectional views illustrating a method for manufacturing the thin film transistor substrate illustrated in FIG. 11.

Referring to FIG. 12, a buffer layer 302 is formed on a base substrate 301. A gate metal layer is formed on the buffer layer 302, and patterned to form a gate metal pattern including a gate electrode 303. The gate metal pattern may further include a gate line connected to the gate electrode 303.

A gate insulation layer 304 is formed to cover the gate electrode 303. A first semiconductor layer 315 is formed on the gate insulation layer 304.

A source metal layer is formed on the first semiconductor layer 315, and patterned to form a source metal pattern including a source electrode 306. The source metal pattern may further include a data line connected to the source electrode 306. As the source metal layer is partially removed, an upper surface of the first semiconductor layer 315 is partially exposed.

Figure 13:
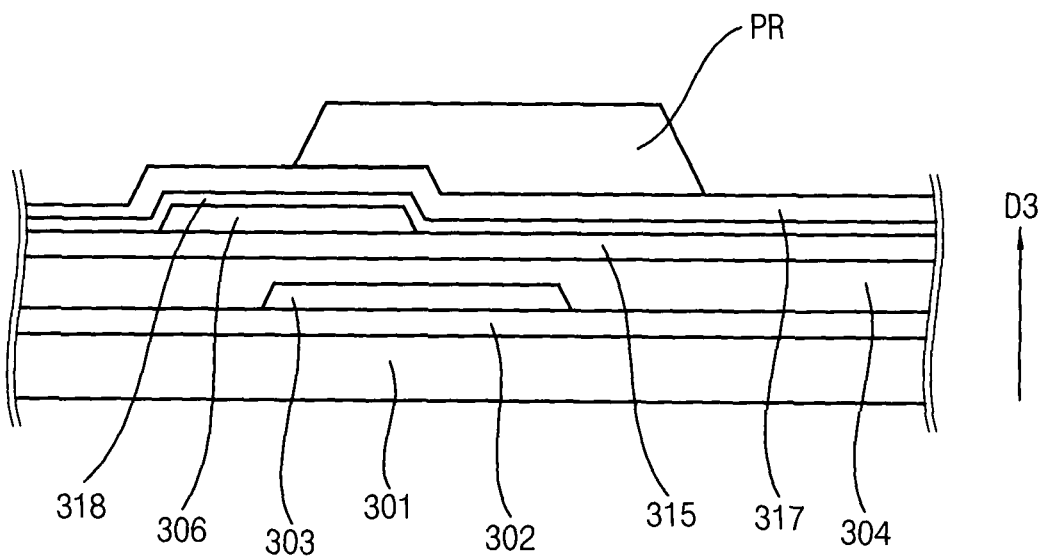

Referring to FIG. 13, a second semiconductor layer 318 is formed to cover the source electrode 306. A drain metal layer 317 is formed on the second semiconductor layer 318.

In an exemplary embodiment, the second semiconductor layer 318 may include a same material as the first semiconductor layer 315. For example, the second semiconductor layer 318 may include a metal oxide based on aluminum, gallium, indium, zinc, tin, hafnium, zirconium or the like, or their combination. For example, the second semiconductor layer 318 may include aluminum zinc oxide, zinc tin oxide, indium zinc tin oxide, aluminum zinc tin oxide, indium gallium zinc oxide or the like. In another exemplary embodiment, the second semiconductor layer 318 may include a different material from the semiconductor layer 315.

A mask pattern PR is formed on the drain metal layer 317. The mask pattern PR partially overlaps the source electrode 306.

Figure 14:
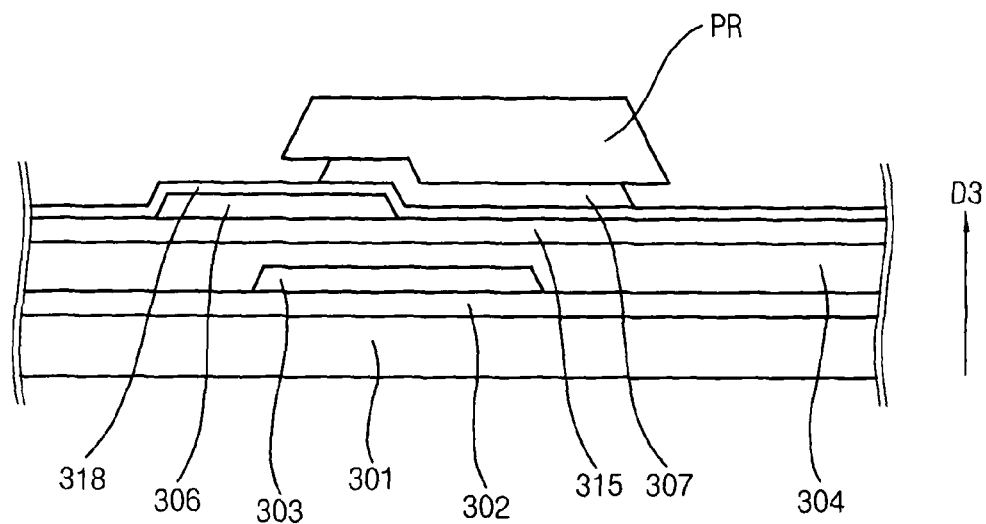

Referring to FIG. 14, the drain metal layer 317 is patterned by using the mask pattern PR as a mask to form a drain electrode 307. The drain electrode 307 partially overlaps the source electrode 306. As the drain metal layer 317 is patterned, the second semiconductor layer 318 is partially exposed.

Figure 15:
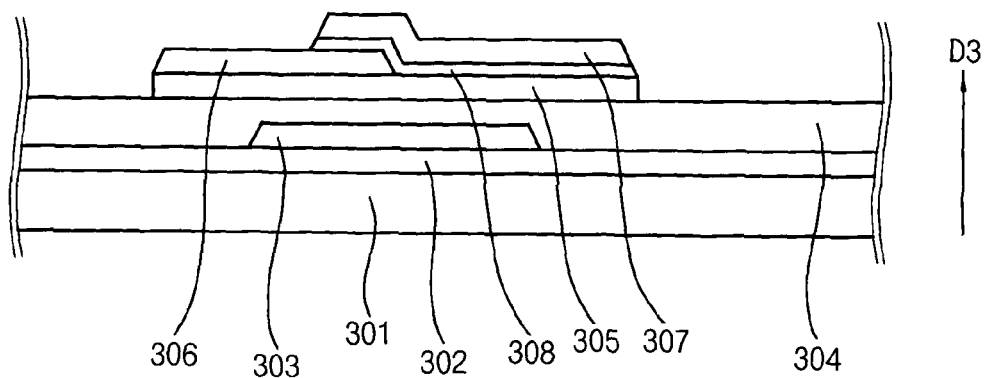

Referring to FIG. 15, the second semiconductor layer 318 is patterned by using the mask pattern PR or the drain electrode 307 as a mask to form a spacer 308. Thus, the spacer 308 may have a substantially same shape as the drain electrode 307 in a plan view. As the second semiconductor layer 318 is patterned, the source electrode 306 is partially exposed.

The first semiconductor layer 315 is patterned by using the source electrode 306 and the drain electrode 307 as a mask to form a channel layer 305.

The channel layer 305 is overlapped by the source electrode 306, the spacer 308 and the drain electrode 307. The source electrode 306, the spacer 308 and the drain electrode 307 are disposed on the channel layer 305. The source electrode 306 and the spacer 308 contact the channel layer 305. The drain electrode 307 is disposed on the spacer 308. Thus, the drain electrode 307 is spaced apart from the channel layer 305 by spacer 308.

Figure 16:
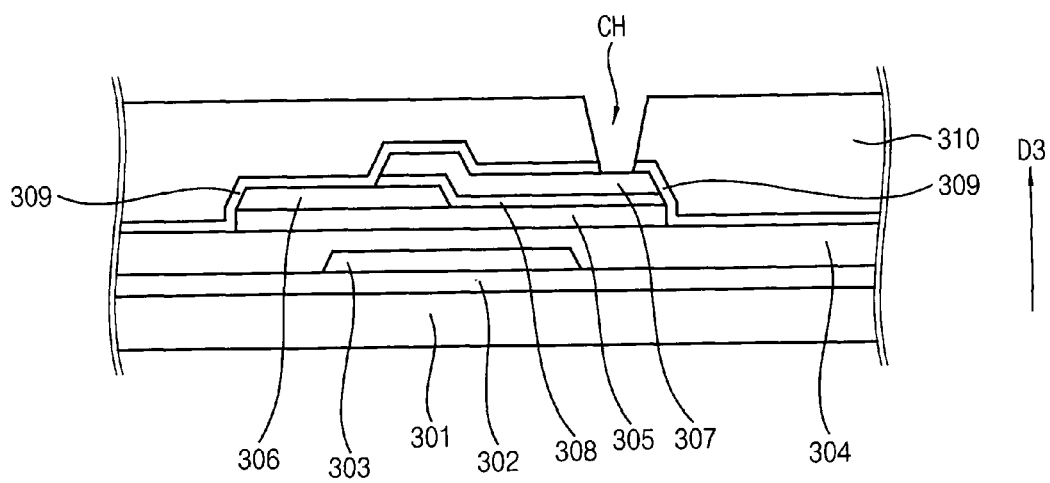

Referring to FIG. 16, a passivation layer 309 is formed to cover the source electrode 306 and the drain electrode 307. A flattening layer 310 is formed on the passivation layer 309.

The flattening layer 310 may be formed from a photoresist composition. A contact hole CH passing through the flattening layer 310 and the passivation layer 309 may be formed through a photolithography process to expose the drain electrode 307.

Thereafter, a pixel electrode contacting the drain electrode 307 is formed on the flattening layer 310, and an alignment layer covering the pixel electrode is formed. The pixel electrode and the alignment layer may be formed through a same process as the pixel electrode PE and the first alignment layer AL1 illustrated in FIG. 10.

According to an exemplary embodiment, the drain electrode 307 and the source electrode 306 overlaps with each other in a plan view, and are spaced apart from each other by the spacer 308 disposed therebetween. Thus, a channel length of the thin film transistor may be minimized or reduced.

Furthermore, since the spacer 308 includes a semiconductive material, even if the drain electrode 307 does not contact the channel layer 305, the drain electrode 307 may be electrically connected to the channel layer 305.

Furthermore, the spacer 308 and the drain electrode 307 may be formed through a same process without using an additional mask.

Figure 17:
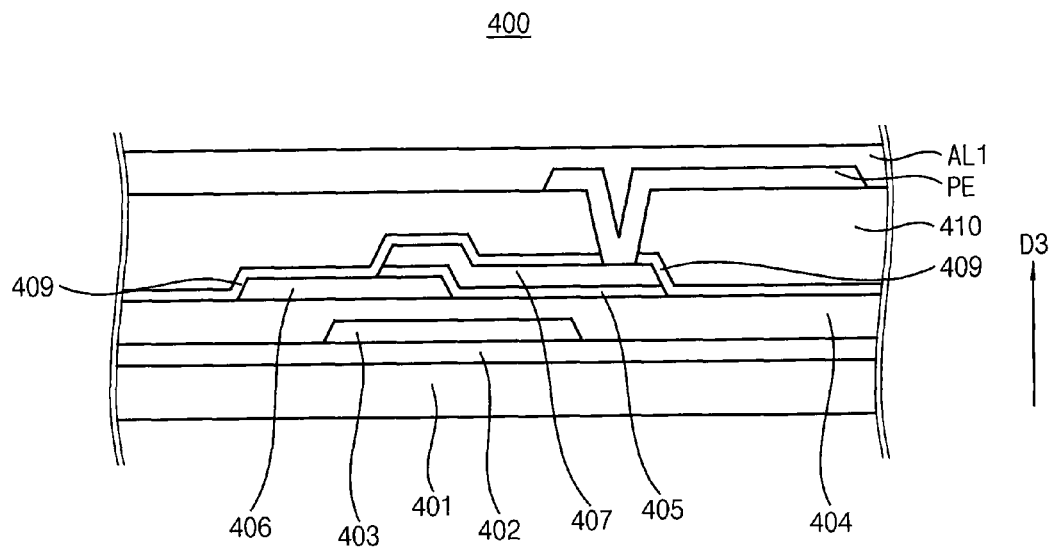
FIG. 17 is a cross-sectional view illustrating a thin film transistor substrate according to an exemplary embodiment.

FIG. 17 is a cross-sectional view illustrating a thin film transistor substrate according to an exemplary embodiment.

Referring to FIG. 17, a thin film transistor substrate 400 includes a base substrate 401, a gate electrode 403, a semiconductor pattern 405, a source electrode 406 and a drain electrode 407. The thin film transistor substrate 400 may further include a buffer layer 402, a gate insulation layer 404, a passivation layer 409, a flattening layer 410, a pixel electrode PE and an alignment layer AL1. The thin film transistor substrate 400 may be substantially same as the thin film transistor substrate 100 illustrated in FIG. 2 except for the semiconductor pattern 405 functioning as a channel as well as a spacer. Thus, any duplicated explanation may be omitted.

The source electrode 406 is disposed directly on the gate insulation layer 404. The semiconductor pattern 405 is disposed on the gate insulation layer 404, and overlaps the source electrode 406 and the drain electrode 407. The semiconductor pattern 405 and the drain electrode 407 partially overlap the source electrode 406. For example, the semiconductor pattern 405 partially covers an upper surface of the source electrode 406. A first portion of the semiconductor pattern 405 is disposed between the gate insulation layer 404 and the drain electrode 407. A second portion of the semiconductor pattern 405 is disposed between the source electrode 406 and the drain electrode 407 to function as a spacer.

For example, the semiconductor pattern 405 may include oxide based on aluminum, gallium, indium, zinc, tin, hafnium, zirconium or the like, or their combination. For example, the semiconductor pattern 405 may include aluminum zinc oxide, zinc tin oxide, indium zinc tin oxide, aluminum zinc tin oxide, indium gallium zinc oxide or the like. Furthermore, the semiconductor pattern 405 may include amorphous silicon, polysilicon or the like.

Thus, when a gate voltage is applied to the gate electrode 403, a data voltage applied to the source electrode 406 may be provided to the drain electrode 407 and the pixel electrode PE through the second portion of the semiconductor pattern 405.

Figure 18:
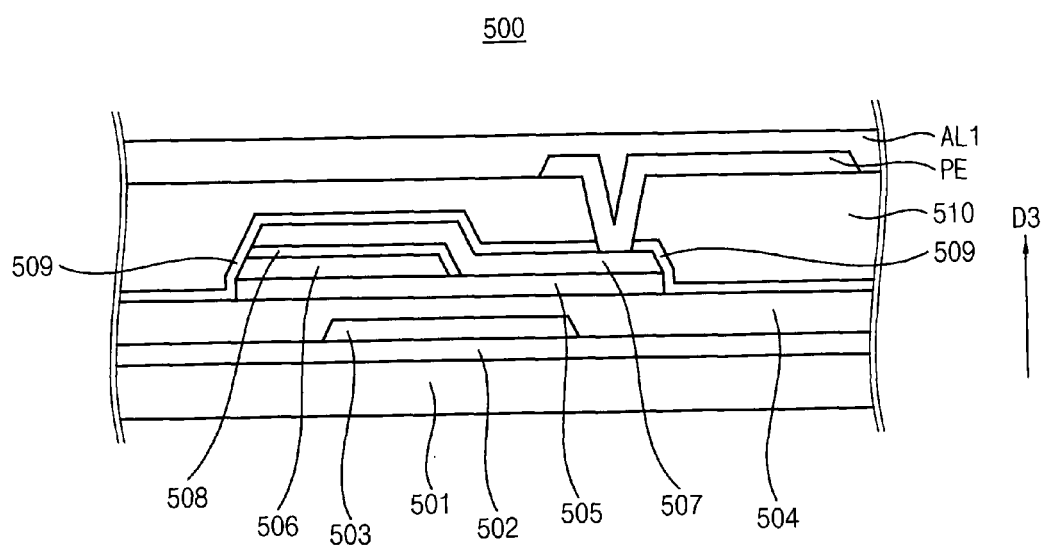
FIG. 18 is a cross-sectional view illustrating a thin film transistor substrate according to an exemplary embodiment.

FIG. 18 is a cross-sectional view illustrating a thin film transistor substrate according to an exemplary embodiment.

Referring to FIG. 18, a thin film transistor substrate 500 includes a base substrate 501, a gate electrode 503, a channel layer 505, a source electrode 506, a drain electrode 507 and a spacer 508. The thin film transistor substrate 500 may further include a buffer layer 502, a gate insulation layer 504, a passivation layer 509, a flattening layer 510, a pixel electrode PE and an alignment layer AL1. The thin film transistor substrate 500 may be substantially same as the thin film transistor substrate 100 illustrated in FIG. 2 except for the spacer 508 and the drain electrode 507. Thus, any duplicated explanation may be omitted.

The channel layer 505 is overlapped by the source electrode 506, the spacer 508 and the drain electrode 507. The source electrode 506, the spacer 508 and the drain electrode 507 are disposed on the channel layer 505. The source electrode 506, the drain electrode 507 and the spacer 508 each contact the channel layer 505.

The source electrode 506 is overlapped by the drain electrode 507 and the spacer 508 in a plan view. The spacer 508 is disposed between the source electrode 506 and the drain electrode 507. A portion of the spacer 508 covers an upper surface of the source electrode 506. A portion of the drain electrode 507 is disposed on the spacer 508. For example, the spacer 508 may cover substantially an entire portion of the source electrode 506.

Figure 19:
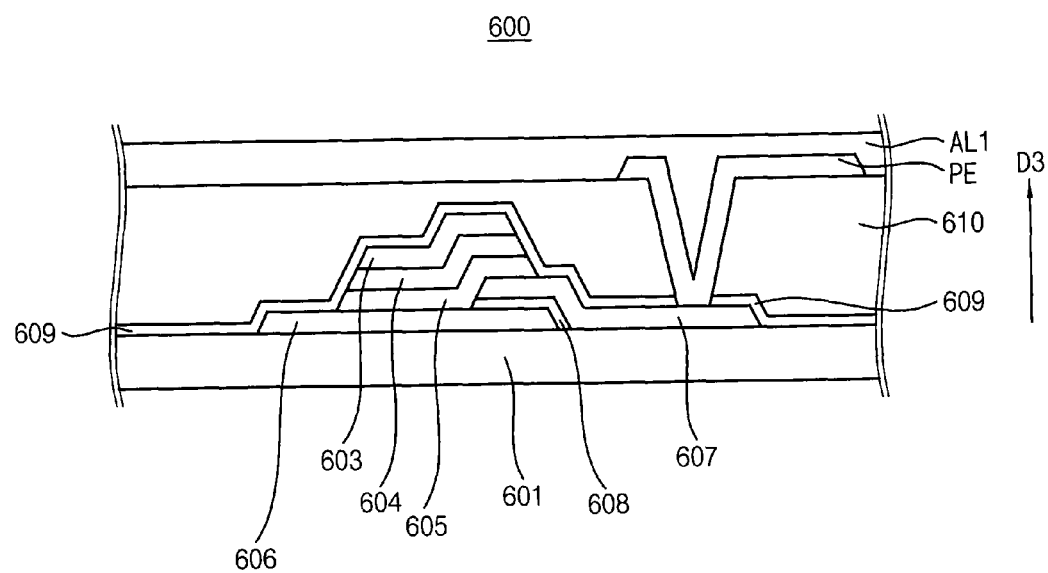
FIG. 19 is a cross-sectional view illustrating a thin film transistor substrate according to an exemplary embodiment.

FIG. 19 is a cross-sectional view illustrating a thin film transistor substrate according to an exemplary embodiment.

Referring to FIG. 19, a thin film transistor substrate 600 includes a base substrate 601, a gate electrode 603, a channel layer 605, a source electrode 606, a drain electrode 607 and a spacer 608. The thin film transistor substrate 600 may further include a gate insulation layer 604, a passivation layer 609, a flattening layer 610, a pixel electrode PE and an alignment layer AL1.

The source electrode 606, the drain electrode 607 and the spacer 608 are disposed on the base substrate 601. The drain electrode 607 and the source electrode 606 overlaps with each other in a plan view, and are spaced apart from each other by the spacer 608.

The channel layer 605 contacts an upper surface of the source electrode 606, an upper surface of the drain electrode 607, and a side surface of the spacer 608.

The gate insulation layer 604 is disposed between the channel layer 605 and the gate electrode 603. The gate insulation layer 604 is disposed on the channel layer 605. In another exemplary embodiment, the gate insulation layer 604 may be disposed entirely on the base substrate 601 to cover the channel layer 605, the source electrode 606 and the drain electrode 607.

The gate electrode 603 is disposed on the gate insulation layer 604.

The passivation layer 609 covers the gate electrode 603, the source electrode 606 and the drain electrode 607.

According to an exemplary embodiment, a channel length of a thin film transistor having a top-gate structure may be reduced.

Figure 20:
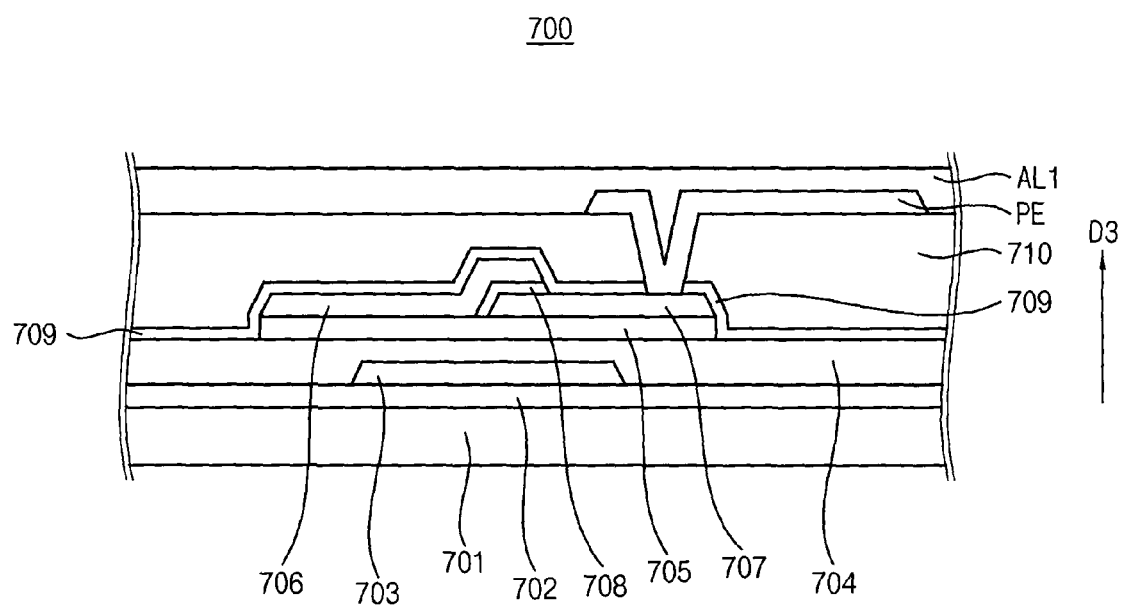
FIG. 20 is a cross-sectional view illustrating a thin film transistor substrate according to an exemplary embodiment.

FIG. 20 is a cross-sectional view illustrating a thin film transistor substrate according to an exemplary embodiment.

Referring to FIG. 20, a thin film transistor substrate 700 includes a base substrate 701, a gate electrode 703, a channel layer 705, a source electrode 706 and a drain electrode 707. The thin film transistor substrate 700 may further include a buffer layer 702, a gate insulation layer 704, a passivation layer 709, a flattening layer 710, a pixel electrode PE and an alignment layer AL1. The thin film transistor substrate 700 may be substantially same as the thin film transistor substrate 100 illustrated in FIG. 2 except for positional relationship of the source electrode 706 and the drain electrode 707. Thus, any duplicated explanation may be omitted.

The channel layer 705 is overlapped by the source electrode 706, the spacer 708 and the drain electrode 707. The source electrode 706, the spacer 708 and the drain electrode 707 are disposed on the channel layer 705. The source electrode 706, the drain electrode 707 and the spacer 708 contact the channel layer 705.

The source electrode 706 overlaps the drain electrode 707 in a plan view. For example, the source electrode 706 may cover a portion of an upper surface of the drain electrode 707.

The spacer 708 is disposed between the source electrode 706 and the drain electrode 707. For example, the spacer 708 may cover a portion of an upper surface of the drain electrode 707.

While the thin film transistor substrates are used for a liquid crystal display device, exemplary embodiments are not limited thereto. For example, thin film transistor substrates according to exemplary embodiments may be used for a display device such as an organic light-emitting display device, or various electronic devices including a thin film transistor.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure.

What is claimed is:

1. A thin film transistor substrate comprising:
  a gate electrode;
  a channel layer overlapping the gate electrode;
  a source electrode, of which at least a portion is disposed above the channel layer and overlaps the channel layer;
  a drain electrode, of which at least a portion is disposed above the channel layer and overlaps the channel layer and the source electrode; and
  a spacer, of which at least a portion is disposed above the channel layer and between the source electrode and the drain electrode, the spacer being in contact with an upper major surface of the channel layer, wherein the spacer includes a metal oxide, wherein the spacer includes an oxide of a metal included in the source electrode or the drain electrode.

2. The thin film transistor substrate of claim 1, wherein the spacer includes at least one of aluminum oxide, copper oxide, molybdenum oxide, manganese oxide and titanium oxide and is produced by a process comprising oxidizing one of the source and drain electrodes.

3. The thin film transistor substrate of claim 1, wherein a thickness of the spacer is about 0.01 μm to about 1 μm, the spacer having an end surface thereof corresponding to a thickness of the spacer that contacts a portion of the upper major surface of the channel layer, the thickness of the spacer corresponding to a length of a channel region of a thin film transistor and corresponding to a length of the portion of the upper major surface of the channel layer that is in contact with the spacer.

4. The thin film transistor substrate of claim 1, wherein an outer boundary of the channel layer corresponds to an outer boundary of the source electrode and the drain electrode in a plan view.

5. The thin film transistor substrate of claim 1, wherein the channel layer serves as an active layer for a thin film transistor that includes the gate, source and drain electrodes.

6. The thin film transistor substrate of claim 1, wherein the source electrode, the drain electrode and the spacer are disposed on the channel layer, the spacer having a side edge surface thereof corresponding to a thickness of the spacer and being in contact with a portion of the upper major surface of the channel layer, the thickness of the spacer corresponding to a length of the channel region in the channel layer, wherein a thickness of the spacer is about 0.01 µm to about 1 µm and corresponds to a channel length formed in the channel layer.

7. The thin film transistor substrate of claim 1, wherein the source electrode, the drain electrode and the spacer are disposed under the channel layer.

8. The thin film transistor substrate of claim 1, further comprising:
 a gate line electrically connected to the gate electrode;
 a data line electrically connected to the source electrode; and
 a pixel electrode electrically connected to the drain electrode.

9. The thin film transistor substrate of claim 1, the thin film transistor substrate being produced by a process comprising:
 forming the gate electrode on a substrate;
 forming the source electrode overlapping the gate electrode;
 forming the metal oxide layer covering the source electrode;
 forming the drain electrode overlapping at least a portion of the metal oxide layer; and
 forming the channel layer overlapping the gate electrode.

10. The thin film transistor substrate of claim 9, wherein forming the metal oxide layer comprises oxidizing a surface portion of the source electrode.

11. The thin film transistor substrate of claim 9, further comprising patterning the metal oxide layer to expose a portion of an upper surface of the source electrode.

12. The thin film transistor substrate of claim 9, wherein forming the channel layer comprises patterning a semiconductor layer disposed under the source electrode by using the source electrode and the drain electrode as a mask.

13. The thin film transistor substrate of claim 9, wherein the metal oxide layer includes at least one of aluminum oxide, copper oxide, molybdenum oxide, manganese oxide and titanium oxide.

14. The thin film transistor substrate of claim 1, wherein the spacer is in direct contact with the source electrode and the drain electrode that the spacer is an oxide of, the source electrode being produced by a process comprising oxidizing one of the source and drain electrodes.

15. A thin film transistor substrate, comprising:
 a gate electrode;
 a channel layer overlapping the gate electrode;
 a source electrode overlapping the channel layer;
 a drain electrode overlapping the channel layer and the source electrode; and
 a spacer disposed between the source electrode and the drain electrode, wherein the drain electrode and channel layer are spaced apart from each other by the spacer, and the spacer includes a semiconductive material.

16. The thin film transistor substrate of claim 15, wherein the spacer includes at least one of amorphous silicon, polysilicon, an organic semiconductor, a chalcogenide semiconductor and a metal oxide.

17. A thin film transistor substrate comprising:
 a gate electrode;
 a semiconductor pattern overlapping the gate electrode;
 a source electrode overlapping the semiconductor pattern; and
 a drain electrode overlapping the semiconductor pattern and the source electrode and spaced apart from the source electrode by the semiconductor pattern, wherein the semiconductor pattern serves as both a spacer and as a channel for a thin film transistor that includes the gate, source and drain electrodes.

18. The thin film transistor substrate of claim 17, wherein the semiconductor pattern covers at least a portion of an upper surface of the source electrode.

19. The thin film transistor substrate of claim 18, wherein the drain electrode is entirely disposed on the semiconductor pattern.

20. The thin film transistor substrate of claim 18, further comprising a gate insulating layer electrically insulating the gate electrode from each of the source and drain electrodes and the semiconductor pattern, the semiconductor pattern being composed of a first portion and a second portion, the first portion being arranged directly on the gate insulating layer and being interposed between the drain electrode and the gate insulating layer, the second portion corresponding to the portion of the semiconductor pattern that covers the portion of the source electrode, the second portion being interposed between the source and drain electrodes, wherein only the second portion serves as the channel.

* * * * *